United States Patent [19]

Suzuki

[11] Patent Number: 5,014,240

[45] Date of Patent: May 7, 1991

[54] SEMICONDUCTOR MEMORY DEVICE

[75] Inventor: Atsushi Suzuki, Kawasaki, Japan

[73] Assignee: Fujitsu Limited, Kawasaki, Japan

[21] Appl. No.: 569,597

[22] Filed: Aug. 14, 1990

Related U.S. Application Data

[63] Continuation of Ser. No. 79,066, Jul. 29, 1987, abandoned.

[30] Foreign Application Priority Data

Aug. 1, 1986 [JP] Japan .................. 61-181567
Aug. 1, 1986 [JP] Japan .................. 61-181568

[51] Int. Cl.$^5$ .............. G11C 7/00; G11C 8/00; G11C 15/00; G11C 15/04
[52] U.S. Cl. .............. 365/49; 365/189.07; 365/230.03; 364/200
[58] Field of Search ............ 365/49, 189.07, 230.09, 365/230.03; 371/21, 31; 307/272.3

[56] References Cited

U.S. PATENT DOCUMENTS

| | | | |
|---|---|---|---|
| 4,045,781 | 8/1977 | Levy et al. ................. | 364/200 |
| 4,228,503 | 10/1980 | Waite et al. ................. | 364/200 |
| 4,244,033 | 1/1981 | Hattori ................. | 365/49 X |
| 4,685,082 | 8/1987 | Cheung et al. ................. | 365/49 |
| 4,696,002 | 9/1987 | Schleupen et al. ................. | 371/12 |
| 4,833,642 | 5/1989 | Ooi ................. | 365/49 |
| 4,945,512 | 7/1990 | De Korske ................. | 365/49 |

Primary Examiner—Alyssa H. Bowler
Attorney, Agent, or Firm—Armstrong, Nikaido, Marmelstein, Kubovcik, & Murray

[57] ABSTRACT

A cache memory stores n parts of a main memory, and the main memory is constituted by N sets. Each set is constituted by a plurality of blocks. A memory unit is provided for storing address data of upper address portions each of which designates a memory set of data stored in an address in the cache memory. The address data are stored in an address in the memory device corresponding to the address in the cache memory. Both the addresses designate a memory block in the designated memory set. A validity unit is provided for storing validity bits for indicating a valid/invalid state of address data in each address of the memory unit. An initialization circuit is arranged to simultaneously invalidate the valid bits. Accordingly, the generation of an erroneous coincidence signal can be prevented, and a data reading operation from the memory device can be performed quickly and satisfactorily.

12 Claims, 11 Drawing Sheets

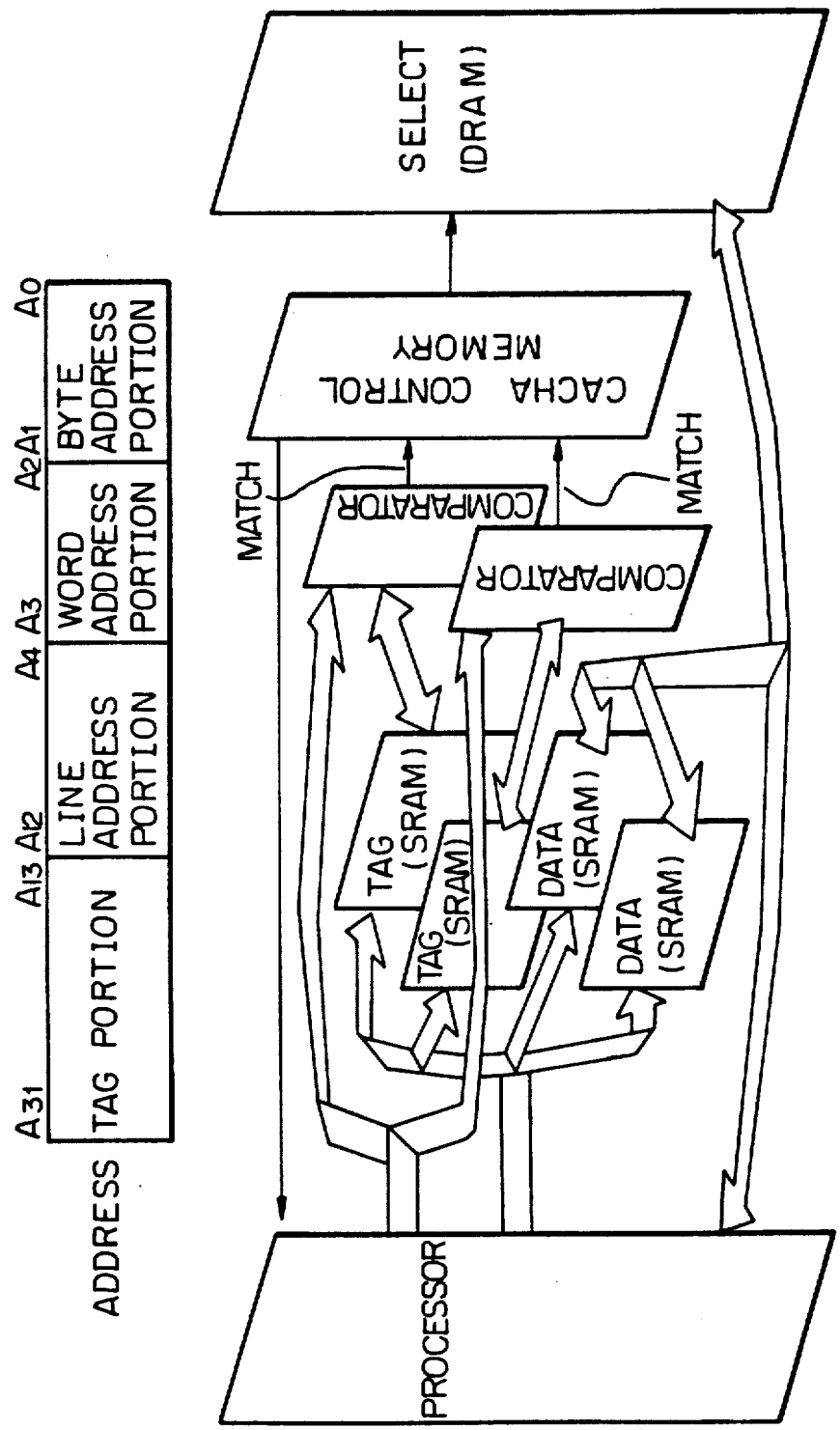

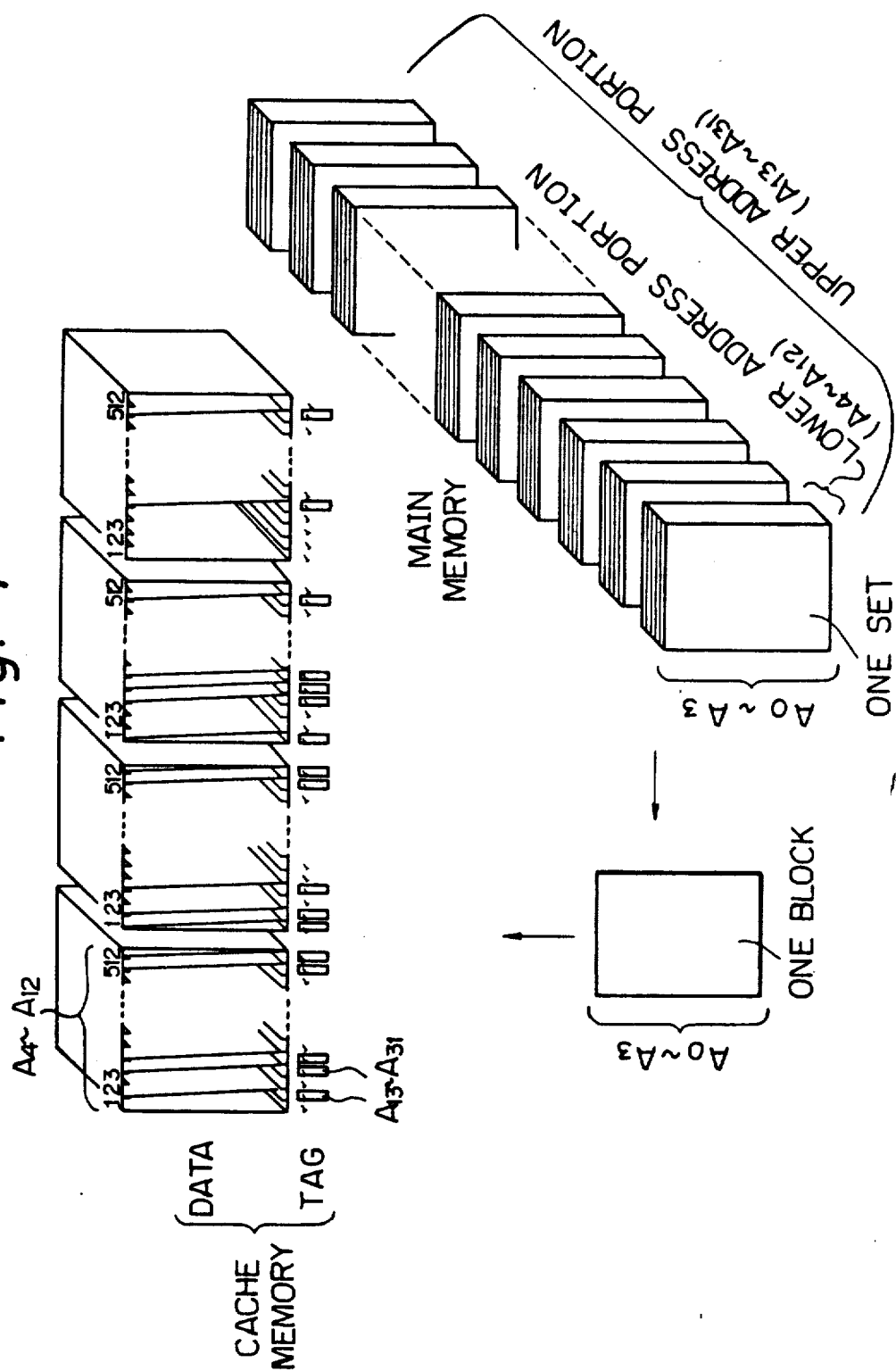

SEMICONDUCTOR MEMORY DEVICE

This application is a continuation of application Ser. No. 079,066 filed July 29, 1987, now abandoned.

BACKGROUND OF THE INVENTION

1. Field of the Invention

The present invention relates to a semiconductor memory device for a data processing system. A semiconductor memory device according to the present invention is applied to, for example, a computer incorporating a cache memory,

2. Description of the Related Art

Since a main memory of a computer is generally connected to a processor through a bus and is given a large capacity by using a dynamic random access memory (DRAM), a long access time is required. In order to reduce the access time, a cache memory constituted by a high-speed static random access memory (SRAM) is used. Data read from the main memory is temporarily stored in the cache memory and the supply of the same data is carried out from this cache memory, thereby reducing the total memory access time.

It is, however, difficult to produce a large-capacity cache memory since it is constituted by an SRAM. In general, the capacity of the cache memory corresponds to a part of the main memory. The main memory is divided into a plurality of sets, and a cache memory is constituted by one, two or four of such sets. For example, one block is constituted by 16 bytes; one set is constituted by 512 blocks; and a main memory is constituted by 524,288 sets. The address portion A0 to A3 allows a selection of one of the 16 bytes of one block; the address portion A4 to A12 allows a selection of one of the 512 blocks of one set; and the address portion A13 to A31 allows a selection of one of the 524,288 sets of the main memory.

Data is stored in the cache memory in units of 16 bytes, as one block of the main memory. The address portion required for storing data in the cache memory is the same lower address portion A4 to A12 of the main memory. In this case, one of the 524,288 sets of the main memory to which the selected block belongs cannot be specified. To prevent inconvenience, the upper address portion A13 to A31 is stored in another memory as a tag memory. The tag memory is accessed by the lower address portion to read the corresponding upper address portion. The upper address portion for accessing the main memory is compared by a comparator with the upper address portion read from the tag memory. If a coincidence between these address portions is established, storage of the desired data in the cache memory has been detected. The cache data memory is then accessed by the lower address portion and the corresponding data is output.

Assume that the main memory data is stored at the same upper address portion of the data memory as the lower address portion A4 to A12 of a given block of the main memory, in units of 16 bytes as one block, and that at the same time, the upper address portion A13 to A31 of the given one block is written in the tag memory. Under these assumptions, the data memory has a capacity corresponding to four sets of the main memory. Therefore, the cache memory can store a maximum of four blocks having the same lower address portion A4 to A12.

The cache memory thus has a capacity of a plurality of sets. However, if all data having the address portion A4 to A12 has already been stored in the cache memory and one block having the address portion A4 to A12 is to be read from a given set of the main memory, the content of the cache memory must be purged. For this purpose, an LRU (Least Recently Used) is often used as a replacement algorithm.

The upper address portion is stored in the tag memory. When the upper address portion of the address data for accessing the main memory coincides with the upper address portion read from the tag memory, storage of the corresponding data is detected. However, when the power source is switched on, the memory data is in a random state. In this state, the upper address portion for accessing the main memory may accidentally coincide with the data read from the tag memory, and storage of the corresponding data in the cache memory is erroneously detected As a result, the random data is undesirably read from the data memory.

SUMMARY OF THE INVENTION

It is an object of the present invention to provide an improved semiconductor memory device using a cache memory in which the initialization of the device by the clearing of all validity bits is carried out at a high speed.

It is another object of the present invention to prevent an excessive current flow from the power source during the clearing of the validity bits.

It is still another object of the present invention to read appropriate data from a cache memory without producing an erroneous coincidence signal.

According to the present invention, there is provided a semiconductor memory device for a data processing system having a main memory, a cache memory, and a central processor unit, the main memory comprising N memory sets, each of the memory sets being constituted by a plurality of memory blocks, the cache memory being adapted to store data of n memory sets where n is smaller than N. The memory device includes a memory unit for storing address data of upper address portions, each of which designates a memory set of data stored in an address in the cache memory, the address data being stored in an address in the memory device corresponding to the address in the cache memory, both the addresses designating a memory block in the designated memory set, a unit for storing validity bits for indicating a valid/invalid state of address data in each address of the memory unit, and an initialization circuit for invalidating all of the validity bits.

BRIEF DESCRIPTION OF THE DRAWINGS

In the drawings,

FIGS. 2, 3, and 4 show examples of a system using a cache memory to which a semiconductor memory system of the present invention is applicable;

DESCRIPTION OF THE PREFERRED EMBODIMENTS

Figure 1:
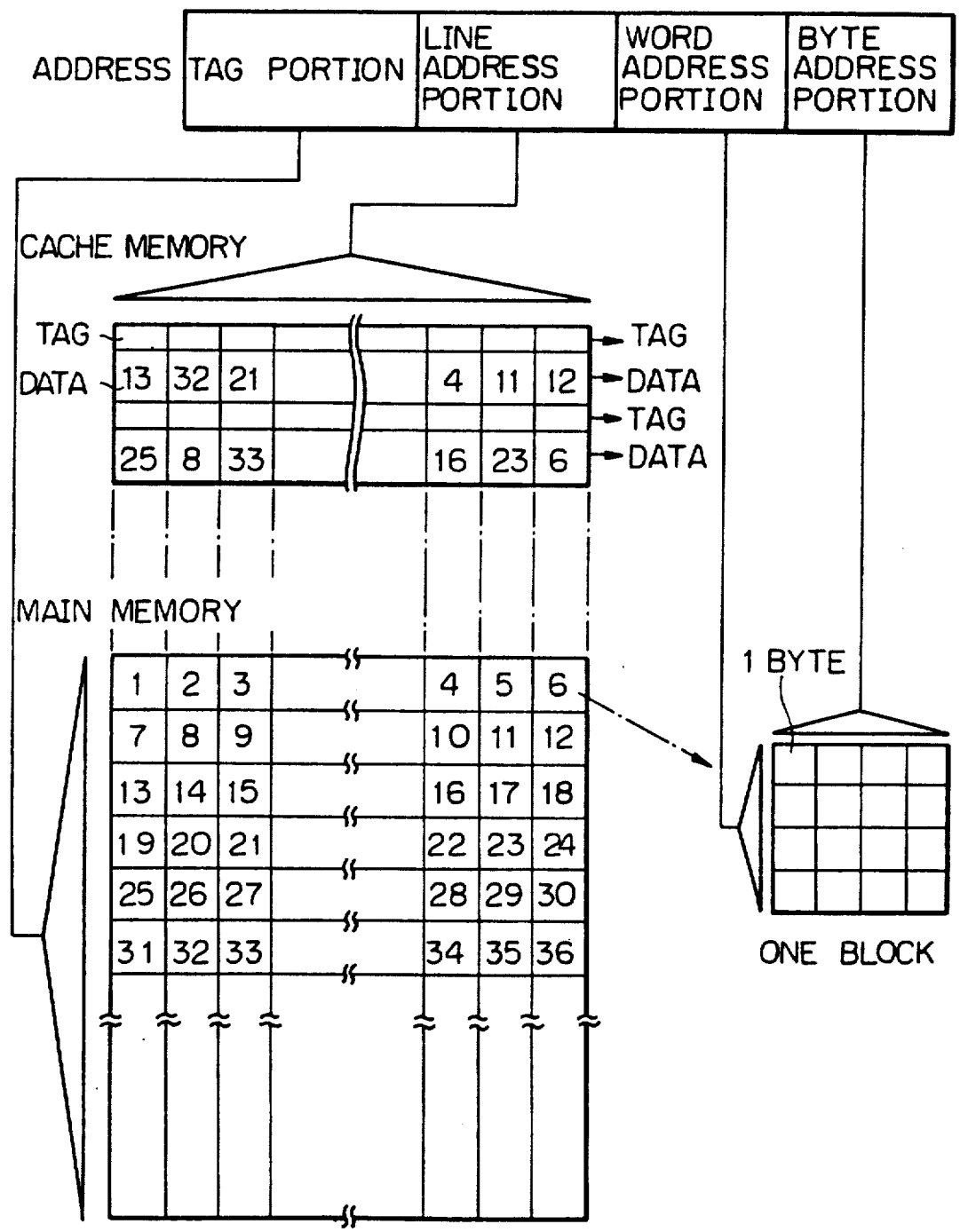
FIG. 1 shows a typical arrangement of a cache memory system.
Figure 2:
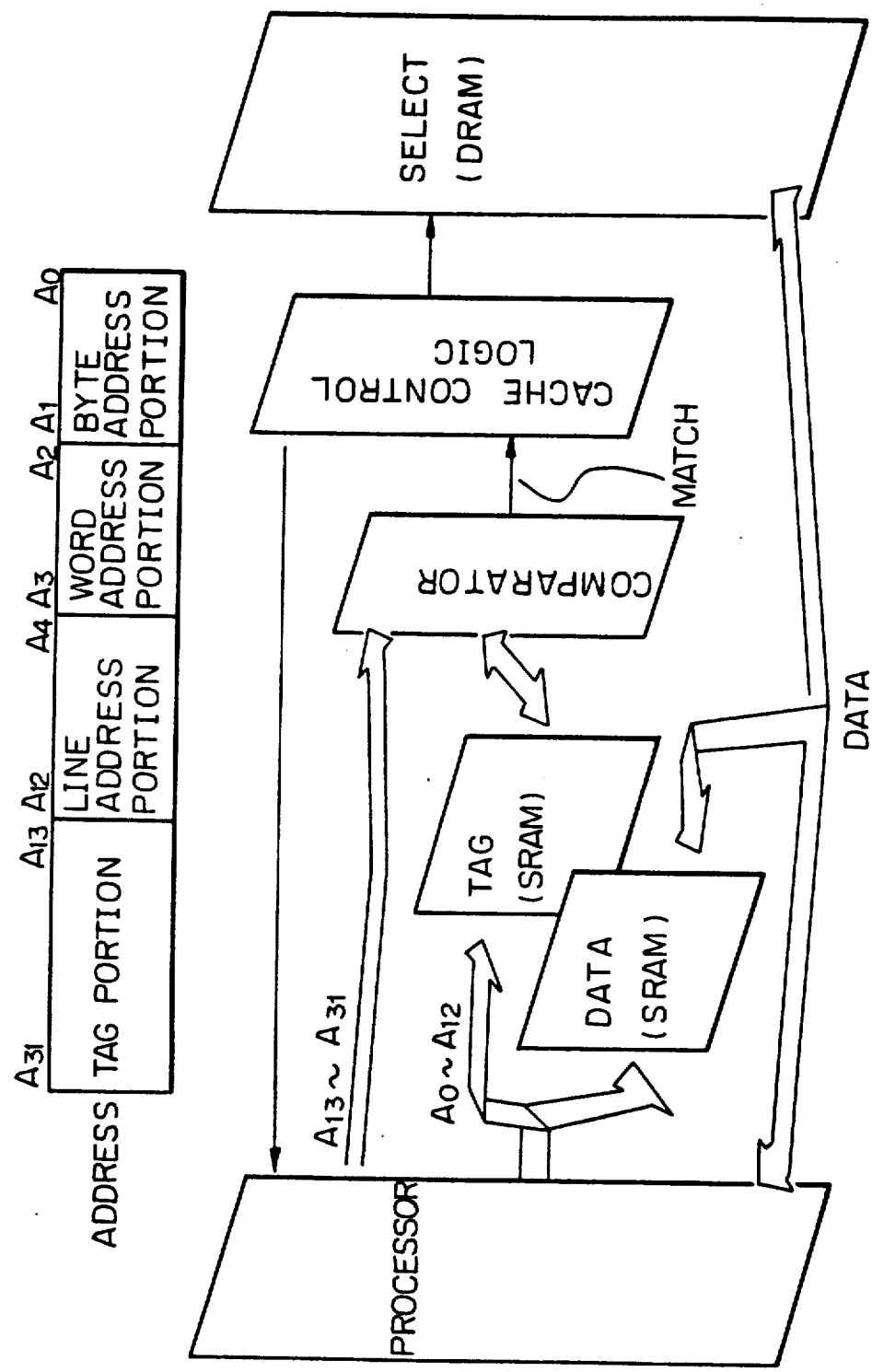

Before describing the preferred embodiment of the present invention, a typical arrangement of a cache memory used in the semiconductor memory system of the present invention is shown in FIG. 1. Examples of the system using a cache memory to which a semiconductor memory system of the present invention is applicable are shown in FIGS. 2, 3, and 4.

In the arrangement of FIG. 1, the row of the main memory is designated by the tag portion of the address, each of the columns of the main memory corresponds to each of the columns of the cache memory, and the column of the cache memory is designated by the line address portion of the address. Each of the rows of the main memory is constituted by a sequence of blocks. An example of one such block is illustrated in FIG. 1. The byte of this one block is designated by the byte address portion of the address. The row which corresponds to a word of this one block is designated by the word address portion of the address.

In this example of FIG. 1, the cache memory is able to store only two sets which correspond to two rows of the main memory. A tag is attached to each data stored in blocks of the cache memory. The tag and the data can be read from each of the rows of the cache memory. The cache memory can be arranged according to various schemes but generally has a capacity corresponding to one, two, or four of a plurality of sets obtained by dividing the memory area of the main memory. FIG. 2 shows a direct map type cache memory whose data memory has a one-set capacity and FIG. 3 shows an associative type cache memory having a 2-sets capacity.

An example of the capacity will be described below. One block is constituted by 16 bytes; one set is constituted by 512 blocks; and a main memory is constituted by 524,288 sets. The address portion A0 to A3 allows a selection of one byte as one row portion from 16 bytes as one block; the address portion A4 to A12 allows a selection of one of the 512 blocks constituting one set; and the address portion A13 to A31 allows a selection of one of the 524,288 sets constituting the main memory.

Data is stored in the cache memory in units of 16 bytes as one block of the main memory. The address portion required for storing data in the cache memory is the same lower address portion A4 to A12 of the main memory. In this case, one of the 524,288 sets of the main memory to which the selected block belongs cannot be specified. To prevent this inconvenience, the upper address portion A13 to A31 is stored in another memory as a tag memory. The tag memory is accessed by the lower address portion to read the corresponding upper address portion. The upper address portion for accessing the main memory is compared by a comparator with the upper address portion read out from the tag memory. If a coincidence between these address portions is established, storage of the desired data in the cache memory has been detected. The cache data memory is then accessed by the lower address portion and the corresponding data is output.

The relationship between the main memory and the cache memory is shown in FIG. 4. Assume that the main memory data is stored at the same upper address portion of the data memory as the lower address portion A4 to A12 of a given block of the main memory in units of 16 bytes as one block, and that at the same time, the upper address portion A13 to A31 of the given one block is written in the tag memory. Under these assumptions, the data memory has a capacity corresponding to four sets of the main memory. Therefore, the cache memory can store a maximum of four blocks having the same lower address portion A4 to A12, as shown in FIG. 4.

The cache memory thus has a capacity of a plurality of sets. However, if all data having the address portion A4 to A12 has already been stored in the cache memory and one block having the address portion A4 to A12 is to be read from a given set of the main memory, the content of the cache memory must be purged. For this purpose, an LRU (Least Recently Used) is often used as a replacement algorithm.

Figure 5A:
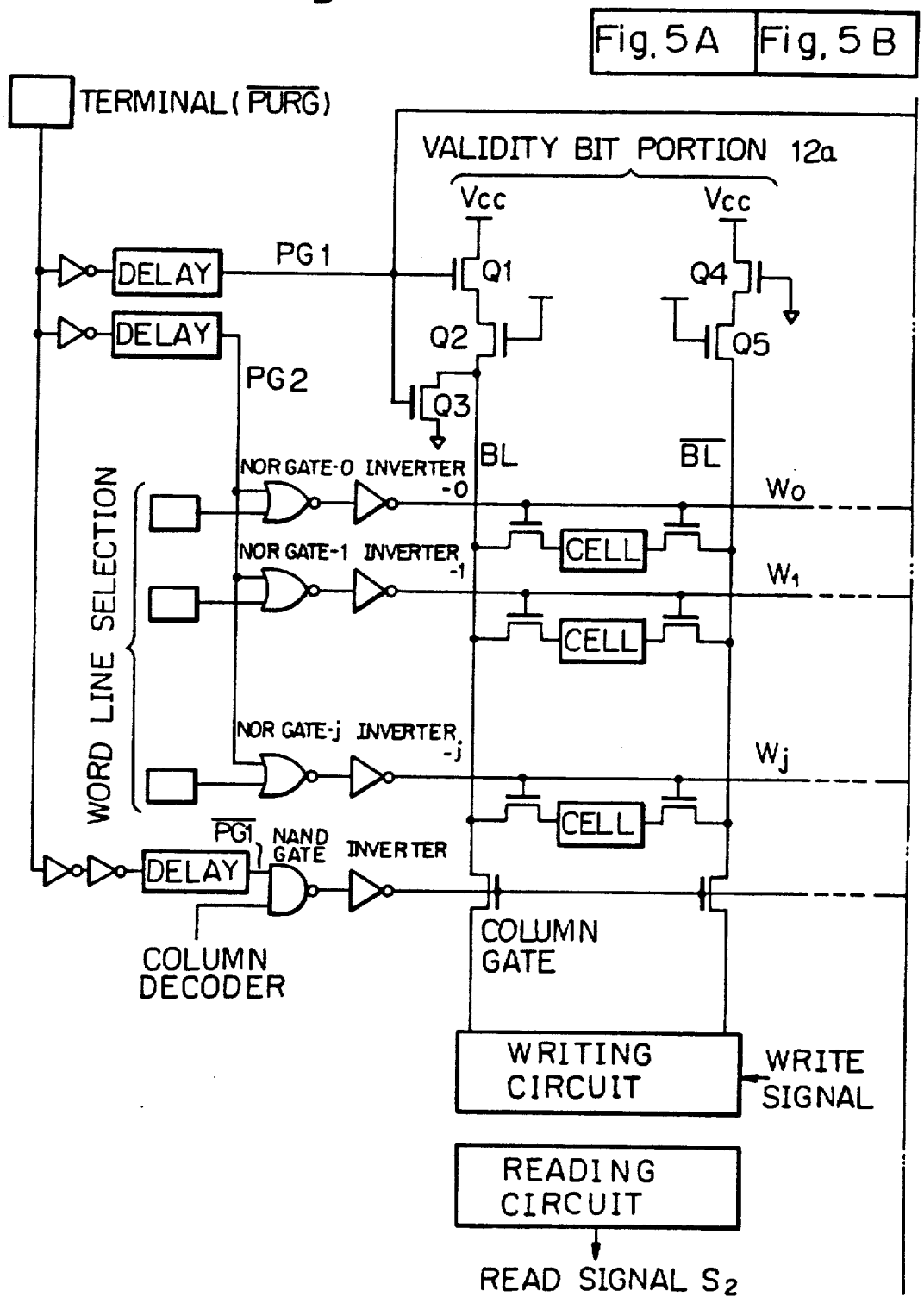
FIGS. 5A and 5B are schematic diagrams of a semiconductor memory device according to an embodiment of the present invention.
Figure 5B:
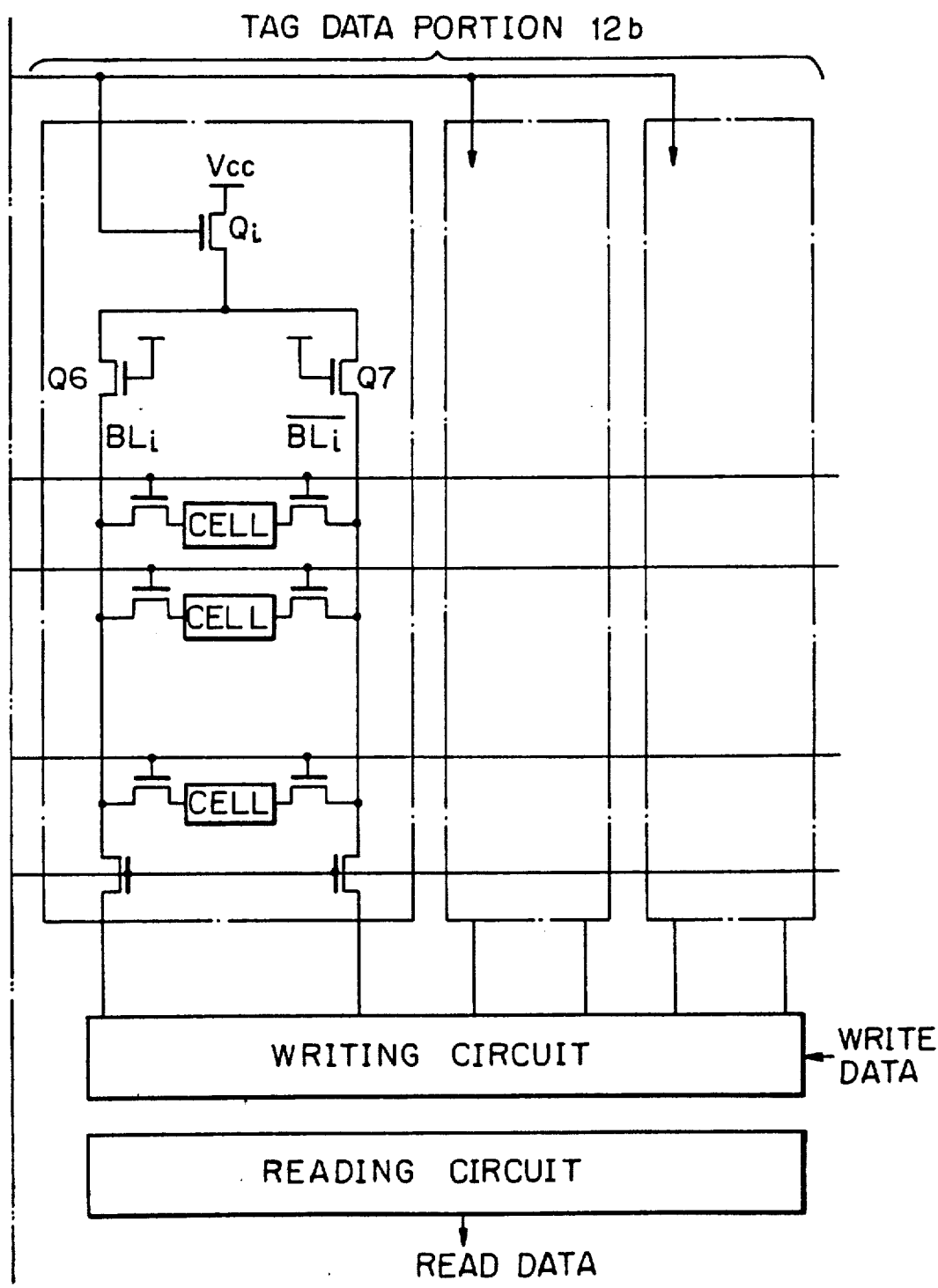
Figure 6:
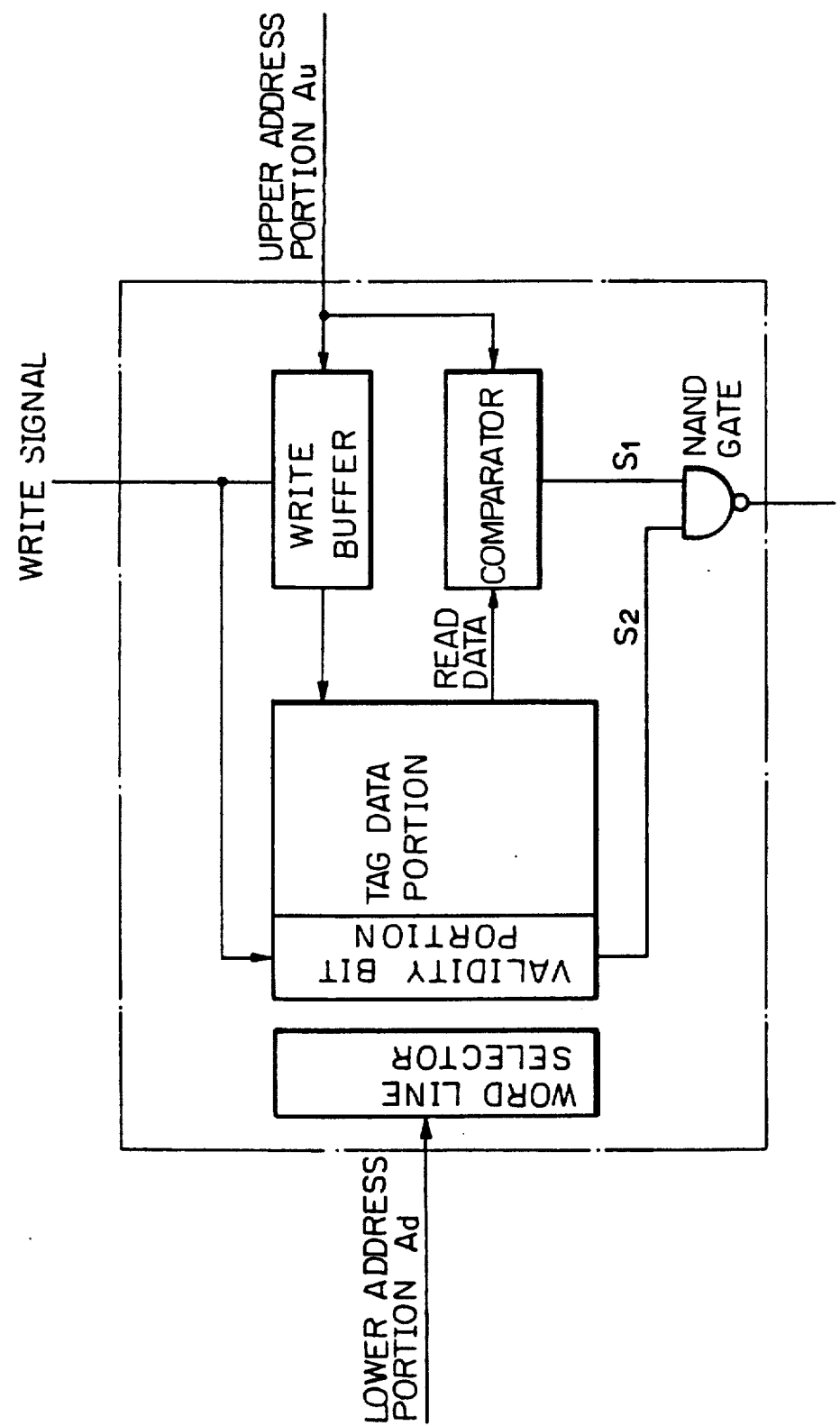
FIG. 6 illustrates the signal input and output operations to and from the semiconductor memory device of FIG. 5 with respect, to one memory section.
Figure 7:
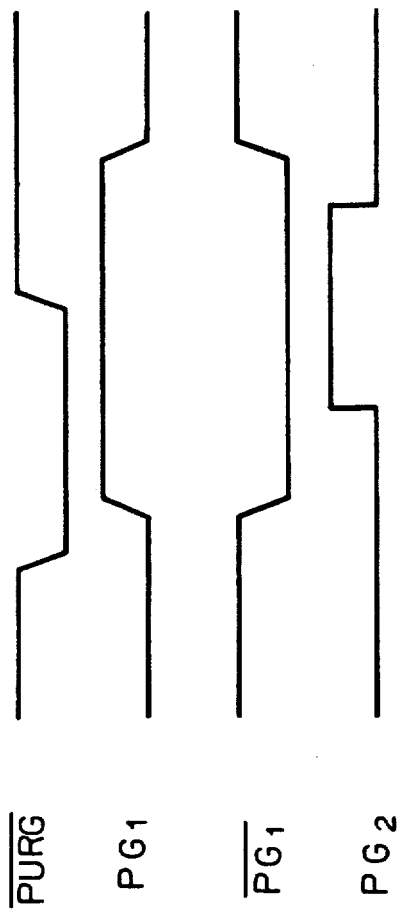
FIG. 7 shows the waveforms of signals appearing in the semiconductor memory device of FIG. 5.

A semiconductor memory device according to an embodiment of the present invention is shown in FIG. 5. The signal input and output operations to and from the semiconductor memory device of FIG. 5 with respect to one memory section are illustrated in FIG. 6. The timing chart of the signals in the device shown in FIG. 5 is illustrated in FIG. 7.

A tag memory constituted by a tag data portion $12b$ and a validity bit portion $12a$ and related circuits are shown in FIG. 5. In the device of FIG. 5, a validity bit is attached to each data stored in the tag data portion in the tag memory 12. If the validity bit is logic "1", the data is considered valid, but if the validity bit is logic "0", the data is considered invalid. A comparator 14 compares the tag memory read data (READ DATA) and upper address portion (Au) of the address for accessing the main memory. If a coincidence between the READ DATA and the Au is established, a coincidence signal $S_1$ is delivered from the comparator 14. That is, the potential of the signal $S_1$ becomes HIGH level. Reference numeral 16 denotes a write buffer. When a write signal WRITE SIGNAL is input, the write buffer 16 defines the upper address portion Au as the write data WRITE DATA and writes this data at the position of the corresponding lower address portion Ad of the tag memory 12. At this time, the validity bit of the lower address portion Ad is set to logic "1".

The tag memory 12 is read-accessed by the lower address portion Ad of the address data for accessing the main memory. The read data READ DATA serves as one input to the comparator 14. The upper address portion Au of the address data for accessing the main memory becomes the comparison data which serves as the other input to the comparator 14. When the READ DATA coincides with the comparison data, the comparator 14 delivers the coincidence signal $S_1$. The output signal $S_1$ serves as one input of a NAND gate. When the tag memory is addressed by the portion Ad, a validity bit $S_2$ of a validity bit portion $12a$ is also read. The read bit $S_2$ serves as the other input of the NAND gate. When the signal $S_1$ is set to a HIGH level as the coincidence output, the signal $S_1$ is also set to a HIGH level; that is, the validity bit is "1" and the data is valid. An output $S_3$ from the NAND gate is set to a LOW level. The inverted signal of this output $S_3$ serves as the coincidence signal, i.e., the hit signal, for giving permission to read the data stored in the cache memory. Even if the coincidence output $S_1$ is delivered from the comparator 14, the coincidence output $S_3$, i.e., a hit output, is not generated when the validity bit is logic "0" and, therefore, $S_2$ is LOW. Therefore, the error caused by random data is prevented.

In a writing mode, the upper address portion Au serves as a write data WRITE DATA and is supplied to the write buffer 16. The write signal WRITE SIGNAL is supplied to the buffer 16 and the tag memory 12. The lower address portion Ad is used to access the tag memory 12, the portion Au is written at the address of a tag data portion 12b corresponding to the address portion Ad, and data "1" is written in the validity bit portion 12a of the tag memory 12.

The device shown in FIG. 5 comprises a circuit for simultaneously initializing all validity bits of the validity bit portion 12a of the tag memory 12 when the power source for the device is switched ON. Reference symbols $\overline{BL}$, and bit lines of the validity bit portion 12a; and $\overline{BLi}$, and bit lines of the tag data portion 12b. The number of bit line pairs is equal to the number of bits Au, but only one pair is illustrated in FIG. 5. The bit lines BL and $\overline{BL}$ are pulled up to a power source $V_{CC}$ through p-channel MOS transistors Q1 and Q4 and n-channel MOS transistors Q2 and Q5, respectively. The bit lines BLi, are pulled up to a source voltage $V_{CC}$ through a p-channel MOS transistor Qi and corresponding n-channel MOS transistors Q6 and Q7, and the bit line BL is pulled down to ground through an n-channel MOS transistor Q3. One of the word lines W0, W1, . . . is selected by the lower address portion Ad by the output from a word decoder. NOR GATE Nos. 0, 1, 2 . . . j, INVERTER Nos. 0, 1, 2 . . . j, a NAND gate, column gates, and memory cells are arranged in the semiconductor memory device. Since the memory device comprises an SRAM, the memory cell is constituted by a flip-flop circuit. The other end of each of the bit lines BL, $\overline{BL}$, BLi, and $\overline{BLi}$ connected to a data a bus through a corresponding column gate.

To set the validity bit of each address portion (Ad) to "0" upon energization of the semiconductor memory device, an external purge signal $\overline{PURG}$ is input to the device. More specifically, the potential of the purge signal $\overline{PURG}$ is set to a LOW level, as shown in FIG. 7. When the potential of the signal $\overline{PURG}$ is set to a LOW level, the potential of a signal PG1 is set to a HIGH level and the potential of a signal $\overline{PG1}$ is set to a LOW level by an internal signal generator (not shown). In this state, the transistor Q1 is turned OFF, the transistor Q3 is turned ON, and the transistor Qi is turned OFF. Therefore, the potential of the bit line BL is set to a LOW level, the potential of the bit line $\overline{BL}$ is set to a HIGH level, and the bit lines BLi and $\overline{BLi}$ are disconnected from the voltage source $V_{CC}$. The potential of the output of the NAND gate is set to a HIGH level and the potentials of the outputs of the inverters I are set to a LOW level, so that the column gates become OFF. The signal generator described above then generates a signal PG2. That is, the potential of the signal PG2 becomes HIGH level. The potentials of the outputs from the NOR GATE Nos. 0, 1, 2 . . . j, are set to a LOW level, and the potentials of the outputs of the INVERTER Nos. 0, 1, 2 . . . j are set to a HIGH level, so that all the word lines W0, W1, ... Wj are selected. The transfer gates of all memory cells are enabled to connect the memory cells to the corresponding bit lines, but since the bit lines BLi and $\overline{BLi}$ portion 12b are kept open, no data is written in the memory cell of this data portion. It is uncertain how the data in memory cells of the data portion undergo a change. Some information may be further written into such memory cells, and under these circumstances, the operation of invalidating the validity bit is carried out under the consideration that the data in the data portion will not be used again, and accordingly, it does not matter how the data in memory cells of the data portion is changed. Since BL is LOW and $\overline{BL}$ is HIGH in the validity bit portion 12a, that is, the data is "0", all memory cells in the validity bit portion are set to logic "0". After the writing, the potential of the signal $\overline{PURG}$ is set to a HIGH level, so that PG2 becomes LOW, PG1 becomes LOW, and $\overline{PG1}$ becomes HIGH.

The simultaneous clearing of the validity bits allows a simultaneous initialization of all validity bits within one to a few cycles. In addition, since all bit lines are disconnected from the voltage source $V_{CC}$, current is not supplied from the voltage source. It should be noted that an excessive current is supplied from the voltage source to the bit lines when all word lines are selected while the bit lines are still connected to the voltage source.

The validity bit may be constituted by a single bit. However, the validity bit component also can be constituted by a plurality of bits and data detected as validity data upon detection of all "1's" of these bits, so that the operation can be further assured.

The simultaneous clearing scheme in the device of FIG. 5 can be utilized for clearing a memory for storing new and old data in the way of the LRU portion.

Figure 8:
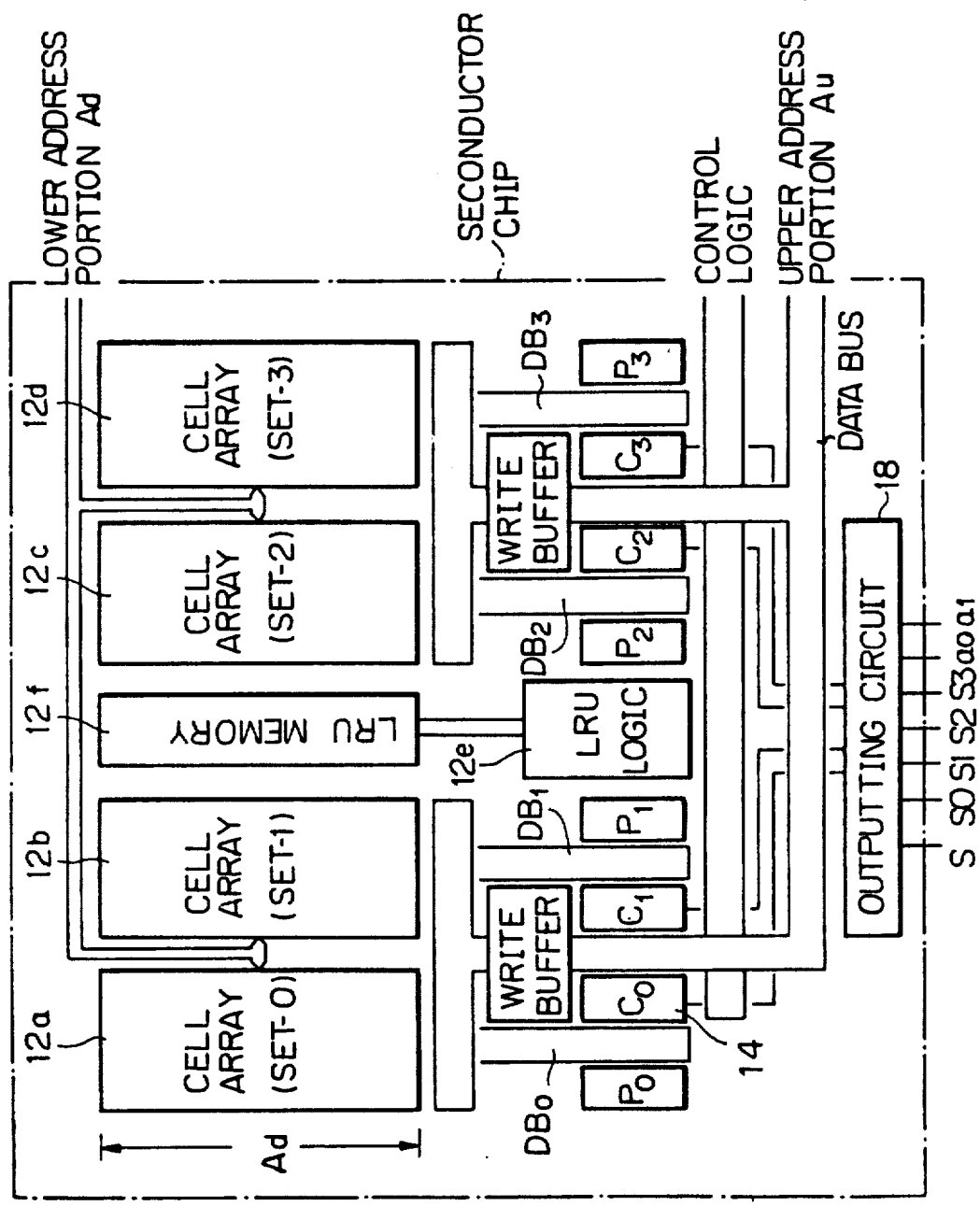
FIG. 8 shows an example of an arrangement of the device for the semiconductor memory device of FIG. 5.

An example of the arrangement of the device of the semiconductor memory device of FIG. 5 is shown in FIG. 8.

A comparator and a replace control circuit in a tag memory in the device shown in FIG. 5 are mounted on a single chip. In the arrangement shown in FIG. 8, there are provided four cell array sets 12a to 12d of the tag memory, data bus, comparators C0 to C3, and parity check circuits P0 to P3. For example, the upper address portion read from the cell array 12a serves as one input of the comparator C0 through the data bus. The other input to the comparator C0 is the comparison data COMPARISON DATA. A coincidence output from the comparator C0 is delivered through an output circuit 18. The output circuit 18 comprises a gate logic and delivers a signal S denoting which of the comparators C0 to C3 generated the coincidence signal, signals S0 to S3 as coincidence signals delivered from the comparators C0 to C3, and signals a0, al as a 2-bit signal code, that is, "00", "01", "10", or "11", denoting which of the comparators C0 to C3 has generated an output. An LRU logic 12e and an LRU memory 12f for determining an object to be replaced are located at the center of the semiconductor chip.

When the comparators are incorporated in the tag memory, a logic operation of coincidence outputs, i.e. hit outputs, is performed to determine whether data is present in the cache memory and a way in which a coincidence, i.e. hit, occurs, as S0 to S3 and a0, al, and determines which way in the data memory will allow a read access, that is, a0, al is used as address data for the data memory. Therefore, the packing density of the device can be increased, and thus the wiring length can be reduced. In addition, the number of elements can be reduced, to obtain high-speed access.

Figure 10:
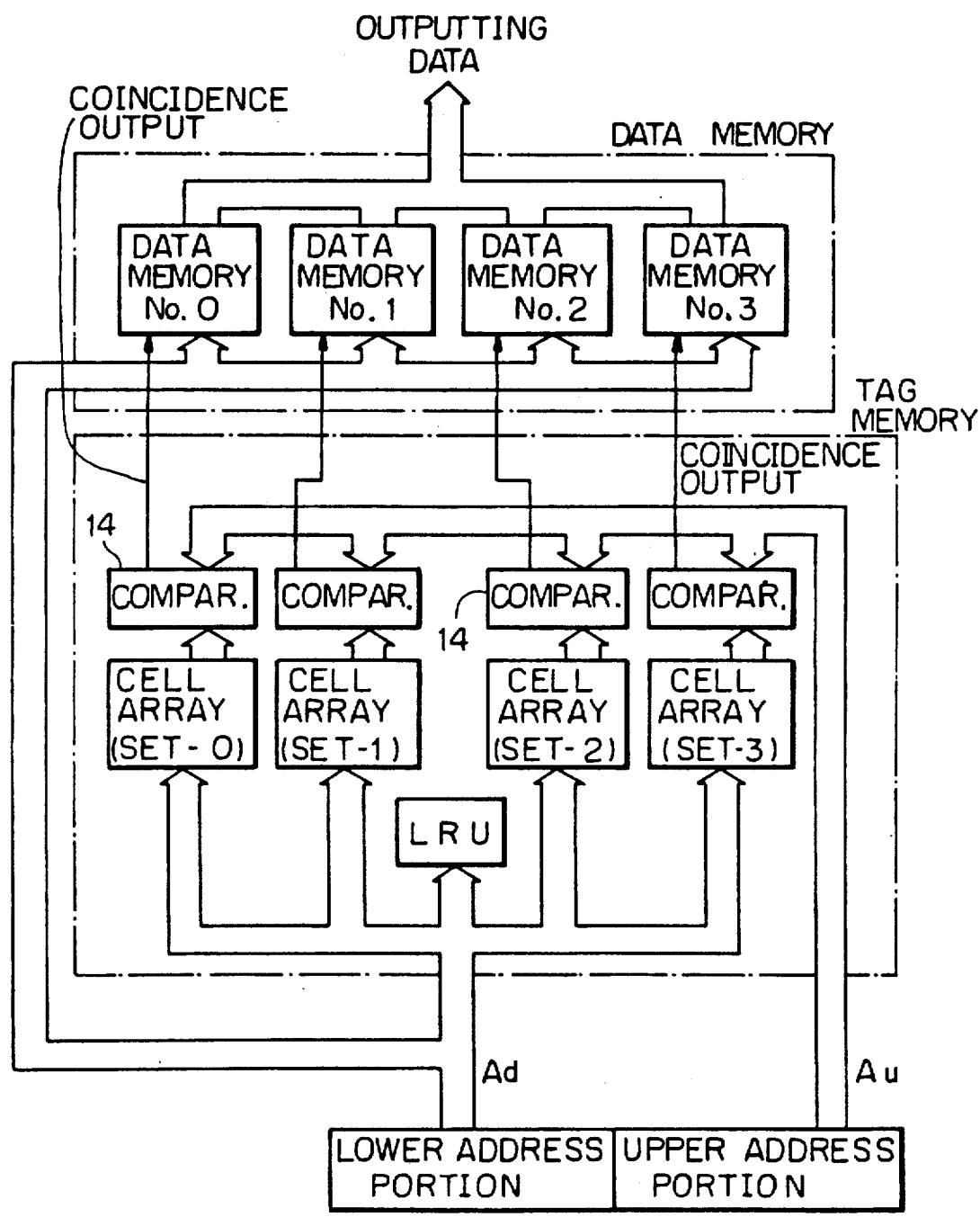
Figure 11:
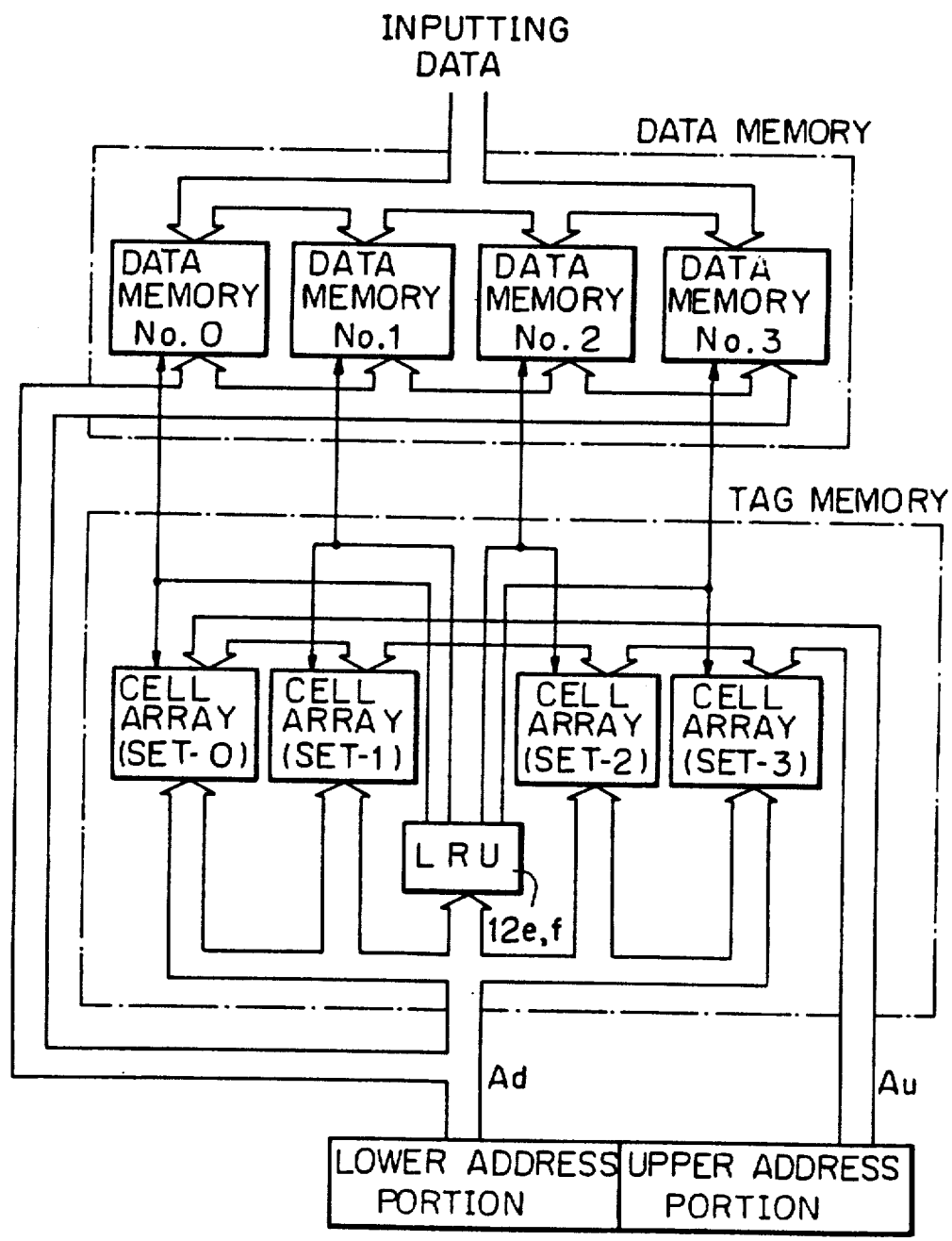

The diagrams for explaining the read operation and the write operation in the semiconductor memory system of FIG. 5 are shown in FIGS. 10 and 11. FIG. 10 shows a read state of the cache memory, and FIG. 11 shows a write state thereof. In the system shown in FIG. 5, the coincidence output from each comparator 14 is supplied to the corresponding data memory, which is then enabled. As shown in FIG. 11, the replace control circuits 12e and 12f determine an object to be replaced. For example, if the object is set-0 in the data memory, the data and tag memories of set-0 are write-enabled, and the corresponding data and the portion Au are written at the address portion Ad.

Figure 9:
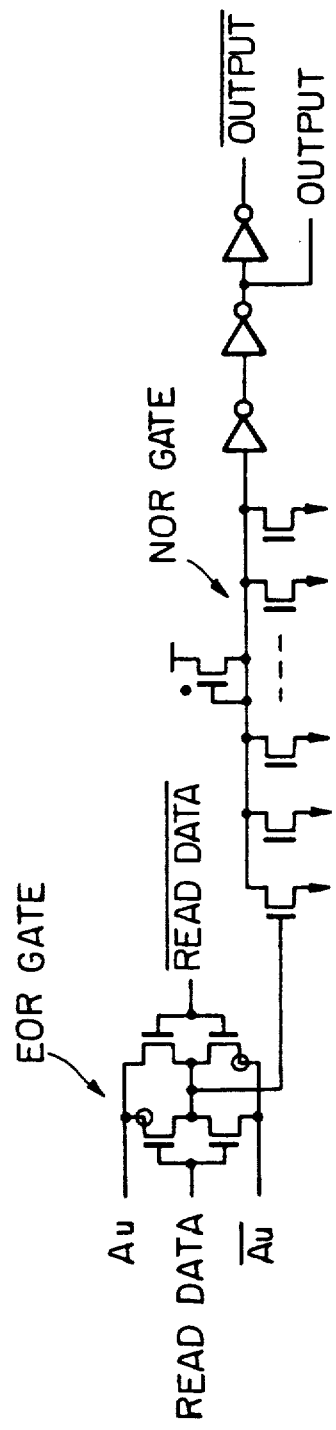
FIG. 9 shows an example of the constitution of the comparator used in the semiconductor memory device of FIG. 5; and, FIGS. 10 and 11 are diagrams for explaining the read operation and the write operation in the semiconductor memory device of FIG. 5.

FIG. 9 shows a detailed arrangement of the comparator 14. The comparator 14 comprises an EOR gate and a NOR gate. When the read data coincides with the comparison data (Au), the potential of the output from the NOR gate is set to a HIGH level, and the potential of the output (OUTPUT) is also set to a HIGH level.

What is claimed is:

1. A semiconductor memory device for a data processing system having a main memory, a cache memory, and a central processor unit, said main memory comprising N memory sets, each of said memory sets being constituted by a plurality of memory blocks, said cache memory to store data of n memory sets where n is smaller than N, said semiconductor memory device comprising:
   memory means for storing address data of upper address portions each of which designates a memory set of data stored in an address in said cache memory, said address data being stored in an address in said memory device corresponding to said address in said cache memory, both the addresses designating a memory block in said designated memory set;
   storage means for storing validity bits which indicate a valid/invalid state of address data in each address of said memory means; and
   an initialization circuit for loading each of said validity bits in each address of said memory means with information indicating said invalid state upon a switching on of a power source of said device.

2. A device according to claim 1, wherein each section of a tag memory of said cache memory comprises a tag data portion and a validity bit portion.

3. A device according to claim 2, wherein said tag data portion comprises pairs of bit lines, word lines, memory cells, transfer gates for the memory cells, and source voltage supply control transistors.

4. A device according to claim 3, wherein one of said source voltage supply control transistors receives a first control signal.

5. A device according to claim 2, wherein the validity bit portion comprises a pair of bit lines, word lines, memory cells, transfer gates for the memory cells, and source voltage supply control transistors.

6. A device according to claim 5, wherein one of said source voltage supply control transistors receives a first control signal.

7. A device according to claim 1, wherein a comparator is connected with each section of a tag memory for making an output signal HIGH when a result of a comparison between the data read from the tag data portion and the upper address portion indicates a coincidence therebetween.

8. A device according to claim 1, wherein a write buffer is connected with each section of a tag memory for writing information of an upper address portion into a designated lower address portion of the tag memory in response to a write signal, a writing of data "1" into the validity bit portion for the lower address portion being simultaneously carried out in correspondence with the write signal.

9. A device according to claim 1, wherein said initialization circuit comprises a word line selecting circuit for selecting all of the word lines of the memory device, and a validity bit invalidation circuit for preventing a supply of voltage to all bit lines of the tag data portion by a voltage source and writing data "0" into the memory cells of the validity bit portion.

10. A device according to claim 1, wherein said initialization circuit invalidates all of said validity bits simultaneously.

11. A semiconductor memory device for a data processing system having a main memory, a cache memory, and a central processor unit, said main memory comprising N memory sets, each of said memory sets being constituted by a plurality of memory blocks, said cache memory to store data of a n memory sets where n is smaller than N, said semiconductor memory device comprising:
   memory means for storing address data of upper address portions each of which designates a memory set of data stored in an address in said cache memory, said address data being stored in an address in said memory device corresponding to said address in said cache memory, both the addresses designating a memory block in said designated memory set;
   storage means for storing validity bits which indicate a valid/invalid state of address data in each address of said memory means; and
   an initialization circuit for simultaneously loading each of said validity bits in each address of said memory means with information indicating said invalid state, all validity bits being simultaneously initialized to an initial value upon a switching-on of a power source of the device, said validity bits having the initial value being sequentially made a predetermined value each time data is written into said cache memory, so that said valid/invalid state of said data is clearly indicated.

12. A semiconductor memory device for a data processing system having a main memory, a cache memory, and a central processor unit, said main memory comprising N memory sets, each of said memory sets being constituted by a plurality of memory blocks, said cache memory to store data of n memory sets where n is smaller than N, said semiconductor memory device comprising:
   memory means for storing address data of upper address portions, each of which designates a memory set of data stored in an address in said cache memory, said address data being stored in an address in said memory device corresponding to said address in said cache memory, both the addresses designating a memory block in said designated memory set;
   storage means for storing validity bits which indicate a valid/invalid state of address data in each address of said memory means; and
   an initialization circuit for invalidating all of said validity bits,
   wherein each section of a tag memory of said cache memory comprises a tag data portion and a validity bit portion, said tag data portion comprises pairs of bit lines, word lines, memory cells, transfer gates for the memory cells, and source voltage supply control transistors, one of said source voltage supply control transistors receives a first control signal, and each of said word lines in the validity bit portion is connected with a series circuit of a NOR gate and an inverter, and said NOR gate receives a second control signal.

* * * * *